United States Patent [19]
Mogi et al.

[11] 3,944,982
[45] Mar. 16, 1976

[54] REMOTE CONTROL SYSTEM FOR ELECTRIC APPARATUS

[75] Inventors: Takao Mogi, Tokyo; Hisao Okada, Yokohama, both of Japan

[73] Assignee: Sony Corporation, Tokyo, Japan

[22] Filed: Aug. 6, 1974

[21] Appl. No.: 495,296

[30] Foreign Application Priority Data
Aug. 16, 1973  Japan.................................. 48-91959

[52] U.S. Cl........ 340/171 R; 340/147 PC; 328/111
[51] Int. Cl.² ...................... H04Q 9/00; H03K 5/20
[58] Field of Search.......... 340/171 R, 147 PC, 148, 340/167 A, 168 R; 328/111

[56] References Cited
UNITED STATES PATENTS

| | | | |
|---|---|---|---|
| 3,611,297 | 10/1971 | Kramer et al.................... | 340/148 X |
| 3,705,363 | 12/1972 | Okada et al. ................ | 340/167 A X |
| 3,836,959 | 9/1974 | Pao et al.............................. | 340/148 |
| 3,852,722 | 12/1974 | Neuville...................... | 340/167 A X |
| 3,855,575 | 12/1974 | Leuschner et al. ............. | 340/148 X |
| 3,858,116 | 12/1974 | Friedl et al. ................. | 340/167 A X |

*Primary Examiner*—Donald J. Yusko
*Attorney, Agent, or Firm*—Lewis H. Eslinger; Alvin Sinderbrand

[57] ABSTRACT

A remote control system for selectively controlling plural functions of electric apparatus comprising a combination of an improved transmitter for generating a command signal of a single frequency which is transmitted intermittently for a plurality of intervals of time, the length of each of which is determined in response to selection of one of the plural functions, and a receiver for receiving the command signal and producing a control signal for controlling the selected function in response to the length of each of the intervals and to the number of the intervals of the received command signal.

10 Claims, 19 Drawing Figures

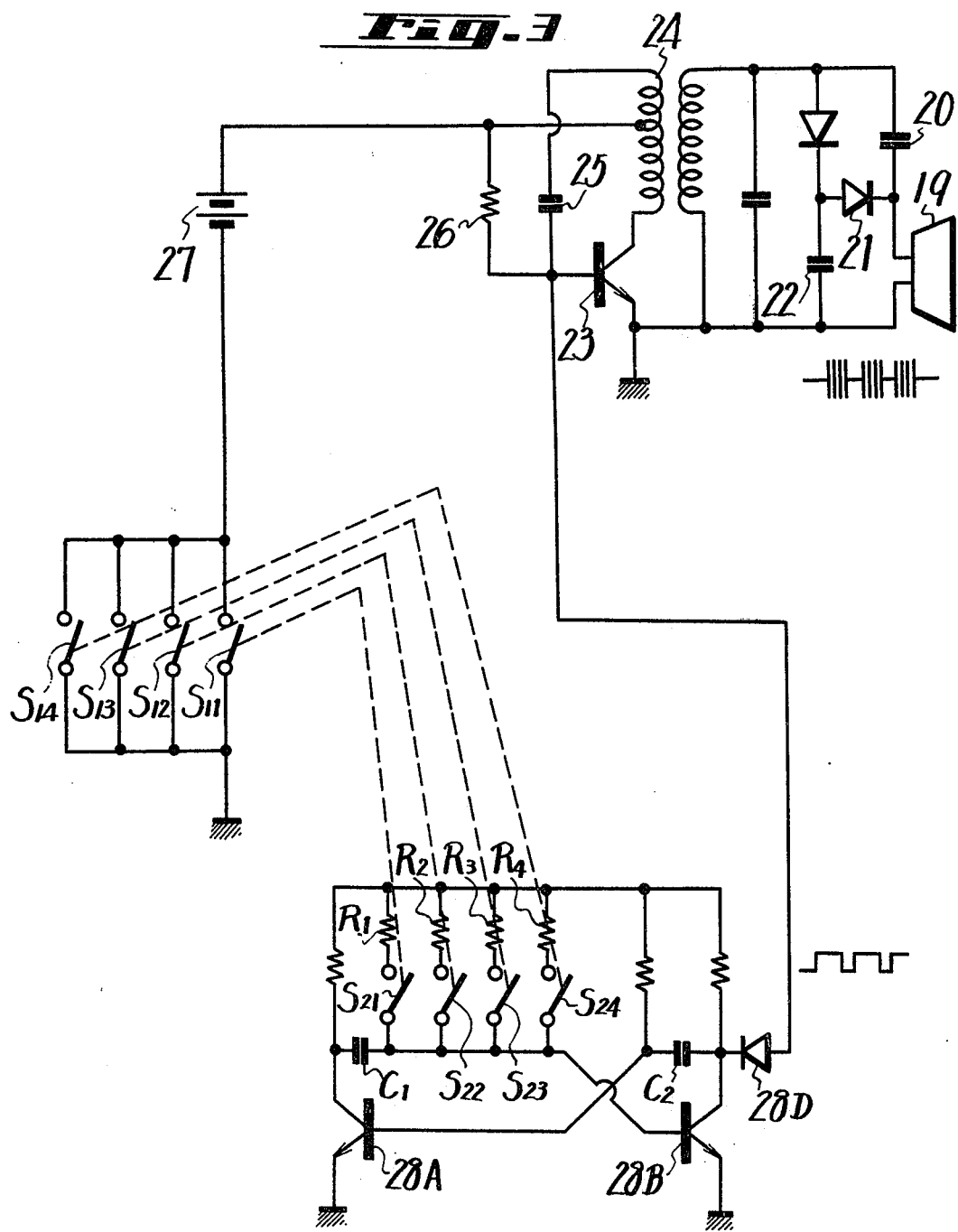

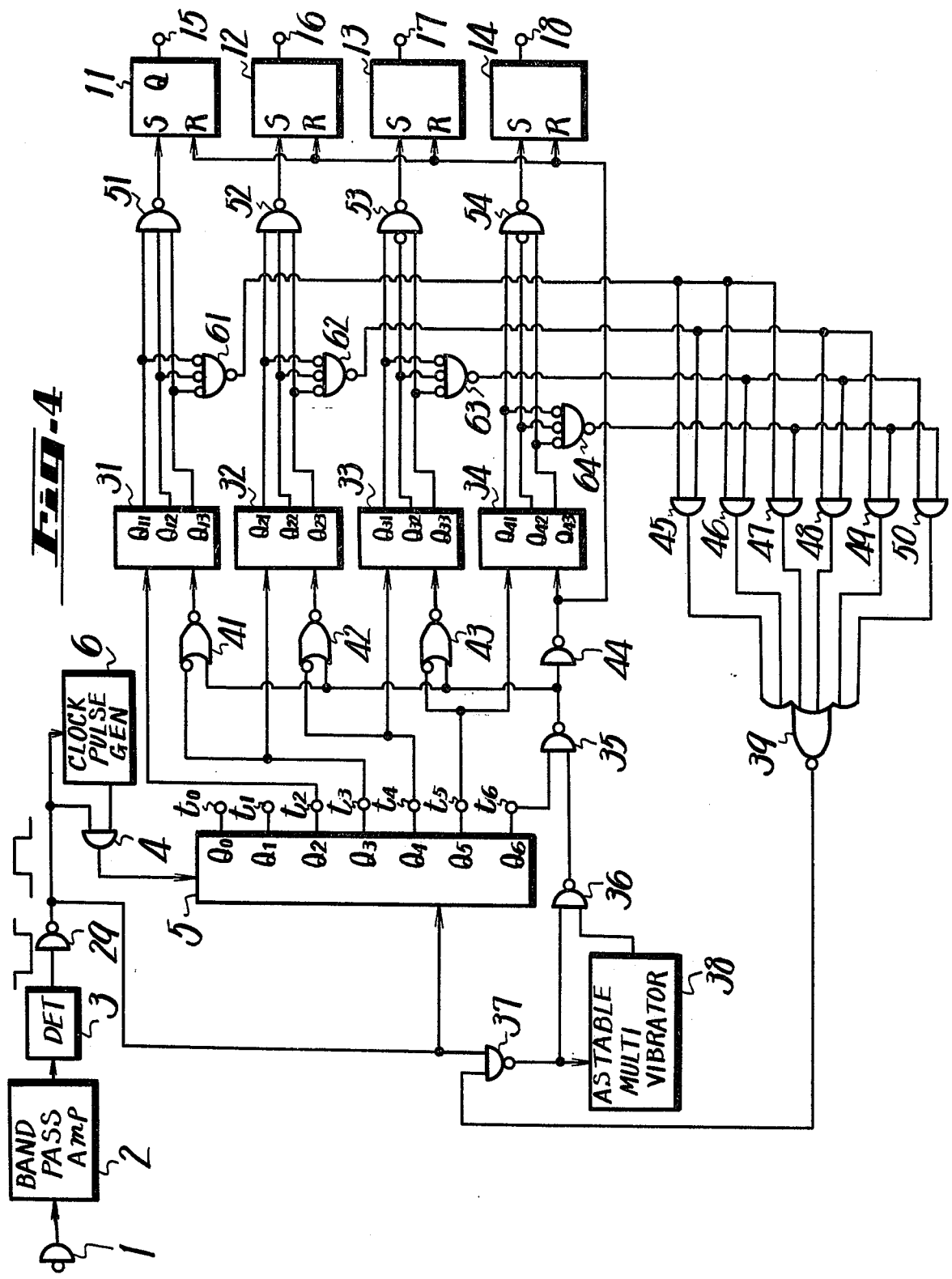

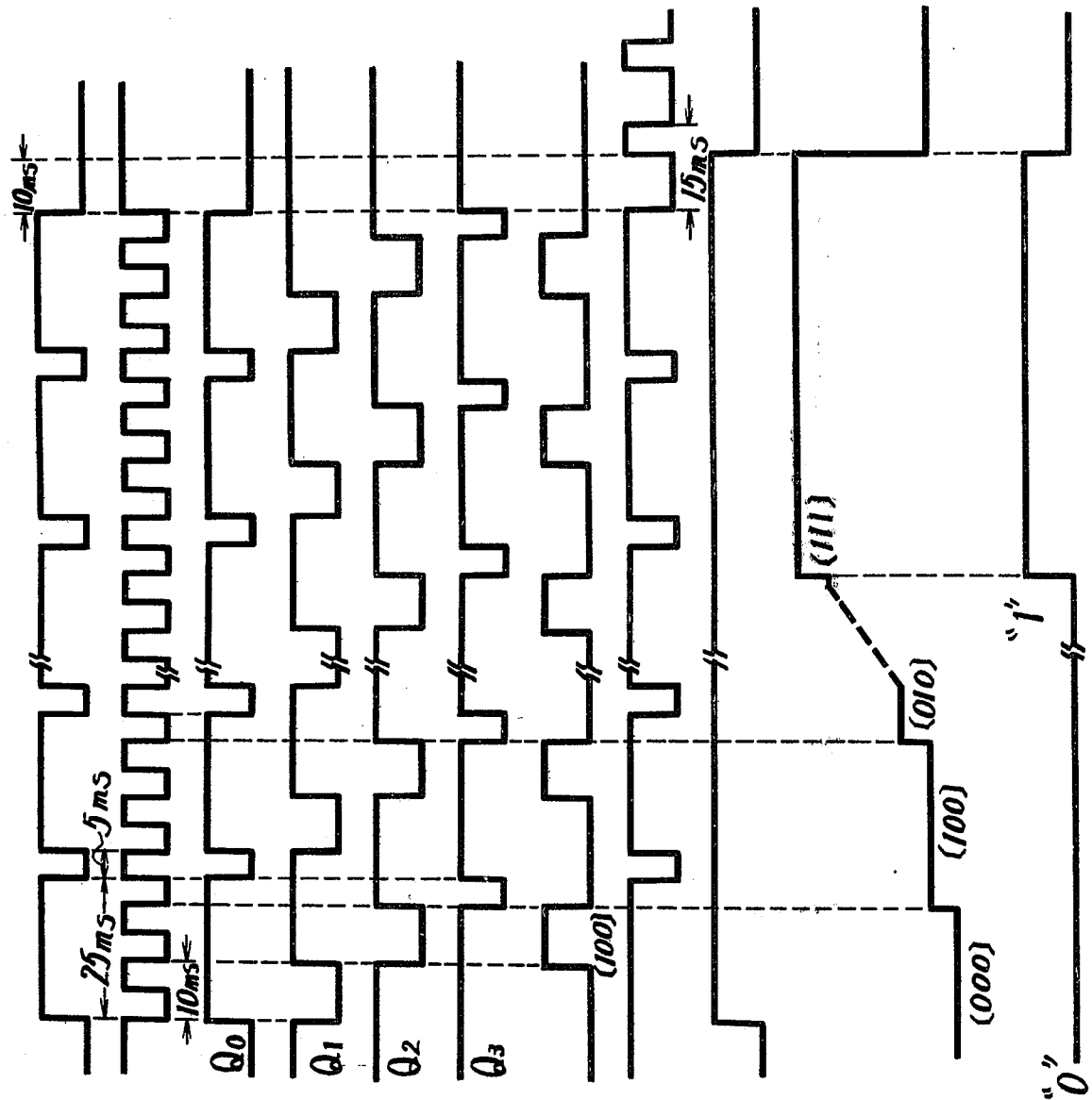

3,944,982

REMOTE CONTROL SYSTEM FOR ELECTRIC APPARATUS

BACKGROUND OF THE INVENTION

1. Field of the invention

This invention relates generally to a system for remotely controlling, for example, a television receiver, and more particularly to a combination of an improved transmitter for transmitting a remote control signal and an improved receiver for receiving the remote control signal adapted to control, for example, a television receiver.

2. Description of the Prior Art

In the art, when a plurality of functions such as ON and OFF operation of an electric power source for a television receiver, its volume adjustment, channel selection and so on are remotely controlled, a plurality of supersonic remote control signals with different frequencies are generally used, in which the frequencies of the remote control signals are made to correspond with control commands. In such a prior art remote contol system, due to the limit or restriction of frequency characteristics of a converting system which converts a supersonic wave transmitted as a control signal into an electric signal, various kinds of control commands can not be transmitted and received. Further, if a number of frequencies are used in a limited frequency range so as to transmit and receive a number of control commands, distances between the frequencies are narrowed and hence there may be a fear that an error operation or misoperation is caused.

To avoid such an error operation, it is desired that, in the remote control system, a transmitted control signal is made to have a single frequency and to be an intermittent signal as a pulse to discriminate the control command by the pulse width or the number of the pulses. Such a type of a remote control system is already proposed now. However, when a pulse signal with a predetermined number or pulse width is transmitted for an instrument such as a television receiver, which is to be controlled, to achieve a predetermined operation, if the number of pulses or the pulse width deviate from the predetermined conditions by, for example, a loose contact of a switch, the misoperation of a transmitter, the affect of a reflected wave and so on, there may be a fear that a misoperation is caused.

SUMMARY OF THE INVENTION

It is an object of the present invention to provide an improved remote control system in which the above mentioned disadvantages inherent in the prior art systems are avoided.

Another object of the present invention is to provide an improved remote control system using a control signal of a single frequency for transmitting a plurality of control commands without causing any misoperation.

In this invention, a signal of a predetermined frequency is transmitted intermittently, from a remote control transmitter, with a unit period representing the type of control commands desired and, in a remote control receiver, the control operation is performed only when a predetermined number of the unit periods of the transmitted signal are received, thereby to avoid the misoperation.

Other objects, features and advantages of the present invention will be apparent from the following description taken in conjunction with the accompanying drawings.

BRIEF DESCRIPTION OF THE DRAWINGS

FIG. 3 is a schematic circuit connection showing one embodiment of the remote control transmitter according to the present invention.

FIG. 4 is a schematic block diagram showing one embodiment of the remote control receiver according to the present invention.

FIGS. 5A–5K are schematic timecharts used for the explanation of the operation of the remote control system comprising the transmitter and the receiver shown in FIGS. 3 and 4.

DESCRIPTION OF THE PREFERRED EMBODIMENTS

Firstly, the theory of the present invention will be now described which is used to remotely control a television receiver, as an example, with reference to FIGS. 1 and 2A to 2E.

Figure 1:
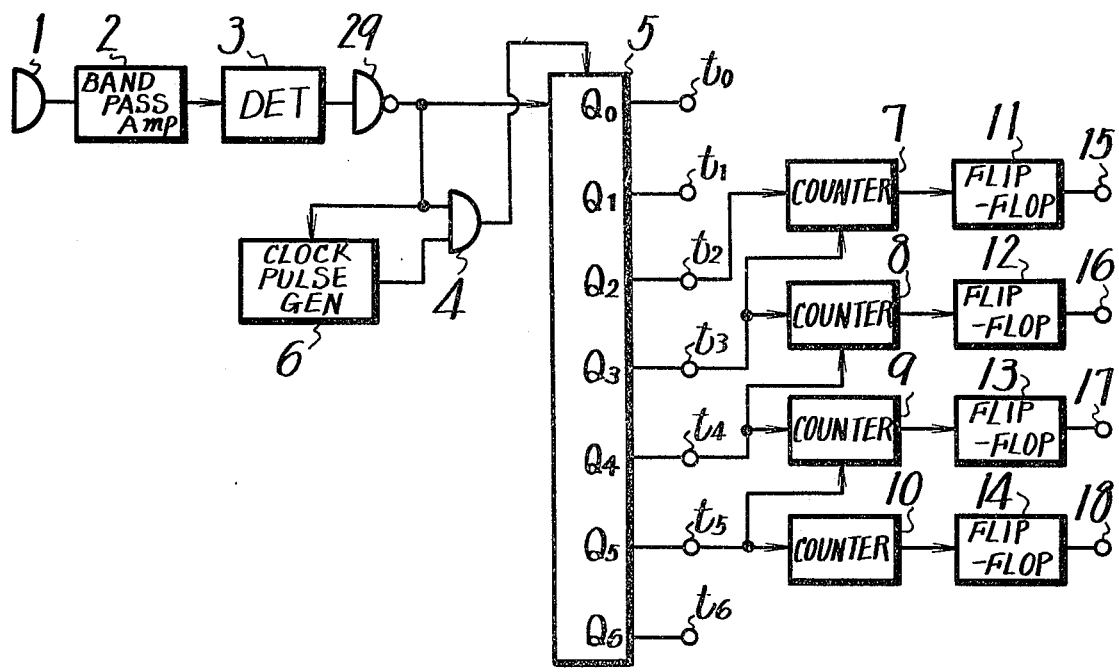
FIG. 1 is a schematic block diagram showing a fundamental structure of the remote control system according to the present invention.
Figure 2A:
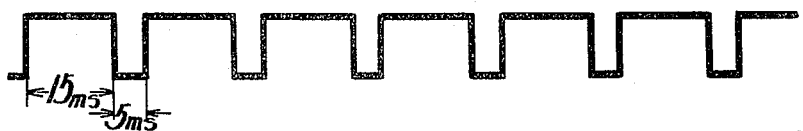
FIGS. 2A–2E are schematic waveform diagrams used for the explanation of a fundamental operation of the remote control system according to the present invention.

In FIG. 1, reference numeral 1 indicates a microphone for receiving a supersonic wave which converts the received supersonic wave into an electric signal or remote control signal and then applies the electric signal to a band pass amplifier 2 which amplifies the received remote control signal and has a frequency characteristic to pass therethrough a remote control signal component with a frequency of, for example, $40KH_z$ only. The signal from the bandpass amplifier 2 is fed to a detector circuit 3 to be detected. As a remote control signal, there are, for example, four kinds each of which is a signal with a frequency of $40KH_z$ and transmitted intermittently. A remote control signal for decreasing the sound volume is a $40KH_z$ signal with a pulse width of 15ms (milli-second) that is repeated at a interval of 5ms in its detected form, as shown in FIG. 2A; a remote control signal for increasing the sound volume is a signal with a $40KH_z$ pulse width of 25ms that is repeated at a interval of 5ms in its detected form, as showm in FIG. 2B; a remote control signal for channel selection is a $40KH_z$ signal with a pulse width of 35ms that is repeated at a interval of 5ms in its detected form, as shown in FIG. 2C; and a remote control signal for switching the voltage source ON and OFF is a $40KH_z$ signal with a pulse width of 45ms that is repeated at a interval of 5ms in its detected form, as shown in FIG. 2D.

The above detected output signals from the detector circuit 3 are applied to a polarity inverter 29 to be polarity - inverted and then to an AND -circuit 4 and also to a first counter or septenary ring counter 5 as a clear input signal. The AND-circuit 4 is further supplied from a clock pulse generator 6 with a clock pulse with a repeating period of, for example, 10ms, as shown in FIG. 2E and the clock pulse applied to the AND-circuit 4 is fed to the ring counter 5. Output terminals $t_0$ to $t_6$ are led out from bits $Q_0$ to $Q_6$ of the ring counter 5, respectively. Second counters, for example, septenary counters 7 and 8 are connected to the output terminals $t_2$ and $t_3$, respectively, and quinary counters 9 and 10 are connected to the output terminals $t_4$ and $t_5$, respectively. The output signals from the septenary counters 7 and 8 are fed to flip-flop circuits 11 and 12 as a reset signal, while the output signals from the quinary counters 9 and 10 are fed to flip-flop circuits 13 and 14 as a set signal, respectively. Thus, the control signal for decreasing the sound volume is obtained at an output terminal 15 connected to the flip-flop circuit 11; the control signal for increasing the sound volume is obtained at an output terminal 16 connected to the flip-flop circuit 12; the control signal for channel selection is obtained at an output terminal 17 connected to the flip-flop circuit 13; and the control signal for switching the power source ON and OFF is obtained at an output terminal 18 connected to the flip-flop circuit 14. The output signal obtained at the output terminal $t_3$ of the ring counter 5 is applied to the septenary counter 7 as a clear signal; the output signal obtained at the output terminal $t_4$ of the ring counter 5 is applied to the septenary counter 8 as a clear signal; and the output signal obtained at the output terminal $t_5$ of the ring counter 5 is applied to the quinary counter 9 as a clear signal.

Figure 2B:
Figure 2C:
Figure 2D:
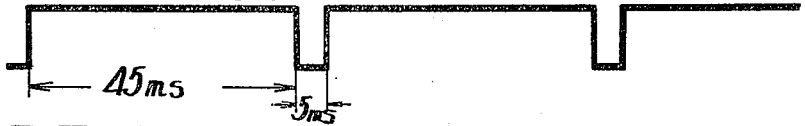
Figure 2E:

With the above system, when the sound volume is desired to be increased, the signal shown in FIG. 2B is obtained from the detector circuit 3 through the polarity inverter 29. When the signal is low in level ("0"), the ring counter 5 is cleared up to make the output terminal $t_0$ low in level (0) but to make the output terminals $t_1$–$t_6$ high in level ("1"). During the time interval when the signal is 1, the clock pulse from the clock pulse generator 6 is applied to the ring counter 5 through the AND-circuit 4. In this case, the ring counter 5 is triggered at the trailing edge of the clock pulse, so that 0 is shifted from the output terminal $t_0$ to the terminals $t_1$, $t_2$ – $t_6$ sequentially at every supply of the clock pulse. When the remote control signal for increasing the sound volume is received, the output signal from the detector circuit 3 becomes 0 at every time interval of 25ms as shown in FIG. 2B. Hence, the duration of the 25ms pulse interval is measured by effectively counting the number of clock pulses which are supplied during the pulse interval. Accordingly, the ring counter 5 is triggered by the trailing edges of three clock pulses during the time interval of 25ms with the result that the output terminal $t_3$ of the ring counter 5 becomes 0, which is counted by the septenary counter 8. Then the counted content of the septenary counter 8 becomes 1. In this case, the output terminal $t_2$ of the ring counter 5 is made 0 at every supply of two clock pulses and at this time the counted content of the septenary counter 7 becomes 1. However, when the next clock pulse is applied to the ring counter 5, its output terminal $t_3$ becomes 0 and hence the septenary counter 7 is cleared up to produce no output signal. Similarly, at every time when the detected output signal with the pulse width of 25ms is produced, the output terminal $t_3$ of the ring counter 5 becomes 0 and, in accordance therewith, the counted content of the septenary counter 8 changes to 2, 3, 4 – 7. When the counted content of the septenary counter 8 arrives at 7, its output signal becomes 0, by which the flip-flop circuit 12 is set. Thus, the output terminal 16 becomes 1 and the control signal for increasing the sound volume is produced at the output terminal 16.

With the present invention described above, since a signal with a single frequency, for example, 40KH$_z$ is used as a transmitted remote control signal, various kinds of control commands can be transmitted and received free from the limitation or restriction caused by the frequency characteristic of the signal converting system and also any misoperation can be avoided. The effects of the present invention will be obvious from the following description on an embodiment of the present invention.

Firstly, a remote control signal transmitter, which produces remote control signals shown in FIGS. 2A, 2B, 2C and 2D, will be now described with reference to FIG. 3.

In FIG. 3, reference numeral 19 designates a supersonic speaker which is supplied with an oscillation output signal with a frequency of 40KH$_z$ through a capacitor 20 and a bias voltage produced by a diode 21 and a capacitor 22. A transistor 23 forms an oscillator with an oscillation frequency of 40KH$_z$. A series connection of an oscillation coil 24 and a tuning capacitor 25 is connected between the collector and base of the transistor 23. The base of the transistor 23 is connected through a base resistor 26 to the positive electrode of a DC voltage source 27 whose negative electrode is grounded through switches $S_{11}$ to $S_{14}$ which are connected in parallel with one another. An astable multivibrator is formed of transistors 28A and 28B. The collector of the transistor 28B is connected to the base of the transistor 23 in the oscillator circuit through a diode 28D which is inserted therebetween with the polarity shown in FIG. 3. The astable multivibrator formed of the transistors 28A and 28B is a well known one in which the collectors and bases there-of are connected through capacitors $C_1$ and $C_2$, respectively. Between the base of the transistor 28B and the positive electrode of the DC voltage source 27, a parallel circuit, which consists of four series circuits of switches $S_{21}$ to $S_{24}$ and resistors $R_1$ to $R_4$ connected in parallel with one another, is inserted. The switches $S_{21}$ to $S_{24}$ are ganged with the switches $S_{11}$ to $S_{14}$, respectively so that, for example, the switches $S_{11}$ and $S_{21}$ are made ON together.

In order to transmit a supersonic wave from the speaker 19, the oscillator circuit consisting of the transistor 23 must perform its oscillation. For the oscillator circuit to operate, it is required that one of the switches $S_{11}$ to $S_{14}$ is made ON, a voltage is applied to the base-collector of the transistor 23, and the transistor 28B of the astable multivibrator is OFF. The time interval within which the transistor 28B is OFF is determined by a time constant which is determined by the capacitor $C_1$ and one of the resistors $R_1$, $R_2$, $R_3$ and $R_4$. Accordingly, if the capacity of the capacitor $C_1$ and the resistance value of the resistors $R_1$ to $R_4$ are selected suitably in value, the pulse signal shown in FIG. 2A can be produced at the collector of the transistor 28B when the switches $S_{11}$ and $S_{21}$ are made ON. Similarly, when the switches $S_{12}$ and $S_{22}$ are made ON, the pulse signal shown in FIG. 2B can be produced; when the switches $S_{13}$ and $S_{23}$ are made ON, the pulse signal shown in FIG. 2C can be produced; and when the switches $S_{14}$ and $S_{24}$ are made ON, the pulse signal shown in FIG. 2D can be produced. As a result, during the time interval within which the switches are made ON, an intermittent supersonic wave can be transmitted from the speaker 19 in response to the ON and OFF of the transistor 28B.

FIG. 4 shows a remote control receiver in which the present invention is adapted and in which the same reference numerals as those used in FIG. 1 designate the same elements.

The remote control signal transmitted from the above mentioned transmitter is received by the receiving microphone 1 whose output signal is applied through the band pass amplifier 2 to the detector circuit 3. With the embodiment of FIG. 4, the detected output signal from the detector circuit 3 is negative and it is inversed by the inverter 29. The output signal from the inverter 29 is applied to the septenary ring counter 5 as a clear input signal and also to one input terminal of the AND-circuit 4 and to the clock pulse generator 6 as a control signal. That is, when the output signal from the inverter 29 becomes 1, the clock pulse generator 6 produces a clock pulse which is applied to the other input terminal of the AND-circuit 4. The clock pulse through the AND-circuit 4 is applied to the septenary ring counter 5 as a clock input signal. The output signal delivered to the output terminal $t_2$ of the ring counter 5 is applied to a binary counter 31 with three bits as a clock input signal. The output signal at the output terminal $t_3$ of the ring counter 5 is applied to a binary counter 32 with three bits as a clock input signal; the output signal at the output terminal $t_4$ of the ring counter 5 is applied to a binary counter 33 with three bits as a clock input signal; and the output signal at the output terminal $t_5$ of the ring counter 5 is applied to a binary counter 34 with three bits as a clock input signal.

The binary counters 31 to 34 are constructed similarly so that when one clock signal is applied thereto, only their first bits $Q_{11}$, $Q_{21}$, $Q_{31}$ and $Q_{41}$ become 1, respectively; when two clock signals are applied thereto, only their second bits $Q_{12}$, $Q_{22}$, $Q_{32}$ and $Q_{42}$ become 1; and when three clock signals are applied thereto, their first and second bits become 1, or three bit output signals of 1, 2, 4 are produced. The binary counter 31 is cleared by the output signal from a NOR-circuit 41 (that is, $Q_{11} = Q_{12} = Q_{13} = 0$), and the binary counters 32 and 33 are cleared by the output signals from NOR-circuits 42 and 43, respectively. The other binary counter 34 is cleared by the output signal from an inverter 44 which is supplied with the output signal from a NAND-circuit 35. The output signal from the NAND-circuit 35 is also applied to the NOR-circuits 41, 42 and 43 as one of the input signals, and the output signals $Q_3$, $Q_4$ and $Q_5$ at the output terminals $t_3$, $t_4$ and $t_5$ of the ring counter 5, which are inverted, are applied to the NOR-circuits 41, 42 and 43 as other input signals, respectively. The output signal $Q_6$ of the ring counter 5 is applied to the NAND-circuit 35 as one input signal and the output signal from a NAND-circuit 36 is applied to the NAND-circuit 35 as the other input signal. The NAND-circuit 36 is supplied with the output signal from a NAND-circuit 37 and the output signal, which has a period of 15ms, from a astable multivibrator 38. The NAND-circuit 37 is supplied with the detected output signal from the detector circuit 3, which is inverted by the inverter 29, and with the output signal from a NOR-circuit 39. The astable multivibrator 38 carries out its oscillation operation only when the output from the NAND-circuit 37 is 1.

The above description relates to the construction and operation for supplying the clock pulse to the ring counter 5, for clearing the ring counter 5, for the operation of the binary counters 31 to 34 responsive to the output signals from the ring counter 5, and for clearing the binary counters 31 to 34. In other words, the ring counter 5 is cleared when the output signal from the inverter 29 is 0 and triggered by the trailing edge of the clock pulse with a period of 10ms from the clock pulse generator 6 through the AND-circuit 4 when the output signal from the inverter 29 is 1. Then, the output signals $Q_0$ to $Q_6$ become 0 sequentially. At every time when the output signal, for example, $Q_2$ of the ring counter 5 is 0, the output signals $Q_{11}$, $Q_{12}$, $Q_{13}$ of the binary counter 31 are changed from [000] to [100]—[111], but when the output signal $Q_3$ of the ring counter 5 becomes 0, the binary counter 31 is cleared. The other binary counters 32, 33 and 34 operate similarly. When the output signal from the NAND-circuit 35 becomes 1, all the binary counters 31, 32, 33 and 34 are cleared at the leading edge of the output signal of the NAND-circuit 35. The output signal from the NAND-circuit 35 is made 1 when the output signal $Q_6$ of the ring counter 5 becomes 0 or that from the NAND-circuit 36 becomes 0. The output signal from the NAND-circuit 36 is made 0 when both the output signals from the NAND-circuit 37 and the astable multivibrator 38 are 1. The astable multivibrator 38 is controlled by the output signal from the NAND-circuit 37 and starts its oscillation when the output signal from the NAND-circuit 37 becomes 1. When the output signal from the NAND-circuit 37 is 0, the astable multivibrator 38 does not oscillate and hence supplies the output signal 1 to the NAND-circuit 36. The output signal from the NAND-circuit 37 is made 1 when the detected output signal, which is inverted by the inverter 29, is 0 because the output signal from the NOR-circuit 39 is 1 normally, which will be described later.

The output signals $Q_{11}$, $Q_{12}$ and $Q_{13}$ from the binary counter 31 are applied to a NAND-circuit 51 whose output signal is applied to the flip-flop circuit 11 to set the same at the trailing edge of the output signal from the NAND-circuit 51. Similarly, a NAND-circuit 52, which is supplied with the output signals $Q_{21}$, $Q_{22}$ and $Q_{23}$ from the binary counter 32, applies its output signal to the flip-flop circuit 12 to set the same at the trailing edge thereof. The output signals $Q_{31}$ and $Q_{33}$ from the binary counter 33 and the inverted version $\overline{Q}_{32}$ of the output signal $Q_{32}$ are applied to a NAND-circuit 53 whose output signal is applied to the flip-flop circuit 13 to set the same at the trailing edge thereof. Similarly, the flip-flop circuit 14 is set at the trailing edge of the output signal from a NAND-circuit 54 which is supplied with the output signals $Q_{41}$, $\overline{Q}_{42}$ and $Q_{43}$ of the binary counter 34. The flip-flop circuits 11 to 14 are reset by the output signal from the NAND-circuit 44 at its trailing edge. Thus, the time when all the flip-flop circuits 11 to 14 are reset coincides with the time when all the binary counters 31 to 34 are cleared. When a set output terminal 15 of the flip-flop circuit 11 is 1, such a control to decrease the sound volume of a television receiver is performed; when a set output terminal 16 of the flip-flop circuit 12 is 1, such a control to increase the sound volume of the television receiver is performed; when a set output terminal 17 of the flip-flop circuit 13 is 1, such a control to select the channel of the television receiver is carried out; and when a set output terminal 18 of the flip-flop circuit 14 is 1, such a control to switch the power source ON and OFF is carried out.

In order to avoid an error operation which may occur by a certain specific cause now described, there are provided in the embodiment shown in FIG. 4 a NAND-circuit 61 which is supplied with the inverted outputs from the binary counter 31; a NAND-circuit 62 which is supplied with the inverted outputs from the binary counter 32; a NAND-circuit 63 which is supplied with the inverted outputs from the binary counter 33; a NAND-circuit 64 which is supplied with the inverted outputs from the binary counter 34; and AND-circuits 45, 46, 47, 48, 49 and 50 which are supplied with two of the outputs from the NAND-circuits 61 to 64 in combination. The outputs from the AND-circuits 45 to 50 are applied to the NOR-circuit 39. When the circuit is in a normal operation, all the AND-circuits 45 to 50 produce outputs of 0. Accordingly, the NOR-circuit 39 produces an output of 1.

The operation of the embodiment of the present invention constructed as above will be now described. By way of example, an operation, in which a normal remote control signal is transmitted from the transmitter for increasing the sound volume and a detected output shown in FIG. 5A is produced from the inverter 29 in the receiver, will be now described.

When the inverter 29 produces an output signal with a pulse width of 25ms and at a pause interval of 5ms, as shown in FIG. 5A, the clock pulse generator 6 produces a clock pulse with a period of 10ms as shown in FIG. 5B. The clock pulse is applied through the AND-circuit 4 to the ring counter 5, so that the output $Q_0$ of the ring counter 5 is made 1 as shown in FIG. 5C at the first trailing edge of the clock pulse, but its output $Q_1$ is made 0 as shown in FIG. 5D. The output $Q_1$ becomes 1 at the second trailing edge of the clock pulse but the output $Q_2$ of the ring counter 5 is made 0 as shown in FIG. 5E. As a result, the output $Q_{11}$ $Q_{12}$ $Q_{13}$ of the binary counter 31 is made [100] as shown in FIG. 5G. At the third trailing edge of the clock pulse, the output $Q_2$ of the ring counter 5 is made 1 and the output $Q_3$ of the ring counter 5 is made 0 as shown in FIG. 5F. Since 00 the output of the inverter 29 becomes 0 after the output $Q_3$ is made 0, the ring counter 5 is cleared thereby and returns to its initial state at which only its output $Q_0$ is 0. When the output $Q_3$ is changed from 1 to 0 as shown in FIG. 5F the binary counter 31 is cleared through the NOR-circuit 41 and the output $Q_{21}$ $Q_{22}$ $Q_{23}$ of the binary counter 32 becomes [100] as shown in FIG. 5J. At this time, the outputs of the NAND-circuit 51 and also the NAND-circuit 52 remain 1, the flip-flop circuits 11 and 12 are in the reset state, and the output terminals 15 and 16 are both 0 as shown in FIG. 5K.

Within the next time interval of 5ms in which the output from the inverter 29 is 0, the clock pulse generator 6 produces no clock pulse and the output therefrom remains at 1. Since the output from the NOR-circuit 39 is 1 when the circuit operates normally, the output from the NAND-circuit 37 is seen to be opposite in polarity to the pulse signal shown in FIG. 5A i.e., the output from the detector circuit 3 passed through the inverter 29. During the time interval in which the output of NAND-circuit 37 is 1, the astable multivibrator 38 initiates an oscillation operation to produce an output as shown in FIG. 5H similar to that shown in FIG. 5A. (If the NAND circuit 37 output is changed to 0 before completion of the oscillation period, the astable multivibrator 38 remains at its quiescent 0 condition.) Since the NAND-circuit 36 is supplied with the outputs of the astable multivibrator 38 and the NAND-circuit 37, the output of the NAND-circuit 36 remains at 1 as shown in FIG. 5I. Further, since the output $Q_6$ of the ring counter 5 is 1, the output of the NAND-circuit 35 is 0, and hence the binary counters 31 to 34 and accordingly the flip-flop circuits 11 to 14 are not reset.

When the remote control signal with the width of 25ms is again received after the time interval of 5ms, the operation described as above will be repeated. At every time when the remote control signal is received, the above operation will be repeated and the output of the binary counter 32 is changed to [010] [110] — sequentially, as shown in FIG. 5J. In order to make the change of the output of the binary counter 32 understood easily, in FIG. 5J the level is changed in a step manner corresponding to the increment in the count accumulated by the counter 32. When seven remote control signals with the width of 25ms are received, the output of the binary counter 32 becomes [111] as shown in FIG. 5J. Thereby, the output of the NAND-circuit 52 is changed from 1 to 0 and the flip-flop circuit 12 is set. As a result, the output of the flip-flop circuit 12 is changed from 0 to 1 as shown in FIG. 5K. At this time, the control for increasing the sound volume commences so that the sound volume is increased in, for example, a step manner. This control for increasing the sound volume is maintained until the switches $S_{12}$ and $S_{22}$ of the transmitter shown in FIG. 3 are made OFF.

If the remote control signal with the width of 25ms shown in FIG. 5A is continued, for example, until a total of nine pulses are received and thereafter this remote control signal terminates, the output of the NAND-circuit 37 becomes 1 and consequently the astable multivibrator 38 initiates its oscillation operation. The oscillation output of the astable multivibrator 38 is made to have a period of 15ms in which 10ms is for the oscillation output of 0 and 5ms is for that of 1. Accordingly, at the time of 10ms after the remote control signal is extinguished, both the outputs of the NAND-circuit 37 and the astable multivibrator 38 are 1 and, consequently the output of the NAND-circuit 36 is falls to 0 from 1, as shown in FIG. 5I. Thus, the output of the NAND-circuit 35 changes 1 from 0 with the result that the binary counters 31 to 34 and the flip-flop circuits 11 to 14 are all reset to be made in such a condition as to be prepared to receive a new remote control signal and to carry out another control function.

The above operation is carried out for the case wherein the remote control signal for increasing the sound volume which having the duration time of 25ms and the pause period of 5ms is received. However, when another remote control signal, such as for decreasing the sound volume, for channel selection or for switching the power source ON and OFF is received, a similar operation is performed. For the case when the remote control signals for channel selection and for switching the power source ON and OFF are received, only five pulses need be successively received to then set the output terminals 17 and 18 of the flip-flop circuits 13 and 14 to 1, respectively. In other words, when five pulses representing the remote control signal for channel section or switching the power source ON and OFF are received successively, the output of the binary counter 33 or 34 becomes [101], the output of the NAND-circuit 53 or 54 is changed from 1 to 0, and then the flip-flop circuit 13 or 14 is set accordingly.

As may be obvious from the above description, with the present invention, many kinds of control commands can be transmitted and received by using a signal of a single frequency as a transmitted remote control signal. Further, the possibility that a misoperation or error operation is reduced will occur significantly.

That is, even if a supersonic wave with a frequency component other than the predetermined frequency (for example, 40KHz) is received, such a supersonic wave is eliminated by the band pass amplifier 2. In addition, even if a supersonic noise wave with the same frequency as that of the transmitted remote control signal is received, the time interval within which the above supersonic noise wave is produced is rather short in general, so that no clock pulse is applied to the ring counter 5 in this case. If the time interval within which the above-supersonic noise wave is produced is relatively long and one clock pulse is applied to the ring counter 5, the ring counter 5 produces an output only at the predetermined output terminal $t_o$, so that no misoperation occurs. Although highly unlikely, if a supersonic noise wave with the same frequency as that of the transmitted remote control signal and with a duration equal to the predetermined duration time (for example, 25ms) is received, an output will appear at the output terminal $t_3$ of the ring counter 5 and the counted content of the binary counter 32 becomes [100]. However, since the flip-flop circuit 12 is not set until a predetermined number of the 25ms pulse signal is received, for example, seven successive pulses each with a pause interval smaller than 10ms, a misoperation will be not caused by even this supersonic noise wave. The predetermined number of control pulses is selected to be fewer in proportion as the pulse duration time of the remote control signal is longer in the above embodiment. This is aimed to avoid the requirement that time interval during which the switch in the transmitter must be closed excessively long.

Further, when the circuit operates normally, two or more outputs of the NAND-circuits 61 to 64, which are connected to the output sides of the binary counters 31 to 34, cannot become 1 together and one of the outputs of the AND-circuits 45 to 50 becomes 1, so that the output of the NOR-circuit 39 does not become 0. Even if the output of the NOR-circuit 39 becomes 0, it terminates within 5ms. However, when the output of the NOR-circuit 39 is held to be 0 for more than 10ms by some abnormal accidents, the output of the astable multivibrator 38 resets the binary counters 31 to 34 and hence the flip-flop circuits 11 to 14 to avoid the occurrence of an error operation.

It will be apparent that many modifications and variations could be effected by one skilled in the art without departing from the spirits and scope of the novel concepts of the present invention.

We claim as our invention:

1. A remote control system wherein plural functions of electric apparatus are selectively controlled in accordance with a received command signal having a single frequency and repetitive transmission periods, the duration of a transmission period being determinative of a particular function, comprising:

receiving means for receiving said command signal;

detecting means coupled to said receiving means for producing pulses having durations corresponding to the durations of the received transmission periods of said received command signal;

measuring means coupled to said detecting means for measuring the duration of each produced pulse and for selectively producing one of a plurality of output pulses in accordance with the measured duration of said produced pulse;

counter means coupled to said measuring means for counting the consecutive number of each of said output pulses produced by said measuring means to thereby provide a count of the number of consecutive repetitions of transmission periods having the same duration which are received by said receiving means; and control signal generating means coupled to said counter means for generating one of a plurality of control signals depending upon the output pulses produced by said measuring means and only if said counter means counts at least a predetermined number of said output pulse representing that at least said predetermined number of consecutive repetitions of a command signal having a selected transmission period has been received, said generated control signal being adpated to control a selected function.

2. A remote control system according to claim 1, wherein said command signal receiving means comprises a microphone and band pass filter means for passing said command signal from said microphone to said detecting means.

3. A remote control system according to claim 1 wherein said measuring means comprises timing means for generating timing pulses of a predetermined timing period, said timing period being less than the smallest transmission period; and timing pulse counting means coupled to said timing means and to said detecting means for counting the number of timing pulses generated during a produced pulse duration and to thereby produce an output pulse corresponding thereto.

4. A remote control system according to claim 3 wherein said timing pulse counting means is comprised of a plurality of output terminals corresponding in number to the number of controllable functions, each of said output pulses being produced at an associated one of said output terminals, whereby the number of timing pulses generated during a produced pulse duration is represented by an output pulse at a selected one of said output terminals.

5. A remote control system according to claim 4 wherein said counter means comprises plural counting circuits each coupled to a corresponding one of said output terminals for counting the number of consecutive output pulses produced at said corresponding output terminal and for generating an output signal when a predetermined count is attained, the count of a counting circuit being reset to an initial count when an output pulse is supplied to another one of said counting circuits.

6. A remote control system according to claim 5 wherein said control signal generating means comprises plural flip-flop circuits each coupled to a selected one of said counting circuits to produce a control signal only when said counting circuit coupled thereto attains said predetermined count.

7. A remote control system according to claim 5 wherein said timing means comprises a clock pulse generator and an AND-circuit having a first input terminal coupled to said clock pulse generator and a second input terminal coupled to said detecting means for generating output clock pulses during the duration of each pulse produced by said detecting means; and said timing pulse counting means comprises a ring counter having a reset input terminal coupled to said detecting means for being reset to an initial state immediately before a pulse is produced by said detecting means and a clock pulse terminal coupled to said AND-circuit for receiving said output clock pulses, said ring counter being successively advanced in response to each output clock pulse to correspondingly advance said output pulse successively from one to another of said output terminals.

8. A remote control system according to claim 6 wherein said control signal generating means further comprises reset means for producing a reset signal to reset all of said plural counting circuits to said initial count and to reset all of said flip-flop circuits to a quiescent state when said command signal terminates.

9. A remote control system according to claim 8 wherein said command signal is constituted by said repetitive transmission periods of variable duration being separated by intervals of constant duration; and wherein said reset means comprise reset pulse producing means coupled to said detecting means for producing said reset signal when an interval following a transmission period exceeds said constant duration.

10. A remote control system according to claim 9 wherein said control signal generating means further comprises error sensing means coupled to all of said counting circuits for sensing when more than one of said counting circuits exhibits more than said initial count; and trigger means responsive to said error sensing means for triggering said reset pulse producing means to produce said reset signal.

* * * * *